(12) United States Patent
Goins et al.

(10) Patent No.: US 7,660,137 B1
(45) Date of Patent: Feb. 9, 2010

(54) HIGH-VOLTAGE MODULATOR SYSTEM

(75) Inventors: Lawrence W. Goins, El Dorado Hills, CA (US); Daniel Goluszek, El Dorado Hills, CA (US)

(73) Assignee: Polarity, Inc., Rancho Cordova, CA (US)

( * ) Notice: Subject to any disclaimer, the term of this patent is extended or adjusted under 35 U.S.C. 154(b) by 693 days.

(21) Appl. No.: 11/494,059

(22) Filed: Jul. 26, 2006

(51) Int. Cl.
*H02M 5/42* (2006.01)
(52) U.S. Cl. .......................................... 363/89; 363/52
(58) Field of Classification Search .................... 363/20, 363/21.01, 52, 53, 54, 85, 89
See application file for complete search history.

(56) References Cited

U.S. PATENT DOCUMENTS

| | | | |
|---|---|---|---|
| 3,315,090 A * | 4/1967 | Bruffey et al. ............... | 327/190 |
| 4,356,457 A | 10/1982 | Di Carlo | |
| 4,454,430 A | 6/1984 | Miller | |
| 4,665,458 A | 5/1987 | Matsuoka et al. | |
| 4,814,966 A | 3/1989 | Ekstrand | |
| 4,939,450 A | 7/1990 | Milberger et al. | |
| 5,019,719 A | 5/1991 | King | |
| 5,206,540 A | 4/1993 | de Sa e Silva et al. | |
| 5,241,260 A | 8/1993 | Beland | |
| 5,255,277 A | 10/1993 | Carvalho | |
| 5,444,610 A | 8/1995 | Gaudreau et al. | |
| 5,594,378 A | 1/1997 | Kruse et al. | |
| 5,646,833 A | 7/1997 | Gaudreau et al. | |
| 5,691,607 A | 11/1997 | Zawislak et al. | |
| 5,736,916 A | 4/1998 | Vlahu | |
| 5,910,746 A | 6/1999 | Fordyce | |
| 6,043,636 A | 3/2000 | Gaudreau et al. | |
| 6,246,598 B1 * | 6/2001 | Tarter et al. ............... | 363/56.01 |
| 6,268,639 B1 | 7/2001 | Li et al. | |
| 6,862,196 B2 * | 3/2005 | Guitton et al. ............... | 363/18 |
| 6,900,557 B1 | 5/2005 | Gaudreau et al. | |
| 7,122,917 B2 * | 10/2006 | Pfister et al. ............... | 307/83 |
| 2007/0024348 A1 * | 2/2007 | Nakayama ............... | 327/536 |

OTHER PUBLICATIONS

Scheffler, C.P., "A TWT Grid Modulator for MTI Radar Transmitters." CH2839-9/90/0000-0492, 1990 IEEE. pp. 492-498.
Ledwich, G., "IGBTs Basics." PowerDesigners, LLC. 1998. 9 pages.
Crewson, Walter F.J., "Solid-State 2kV 250kHz Grid Modulator for Traveling-Wave Tubes." CH2662-8/88/0000-0028, 1998 IEEE. pp. 28-33.
Reggia, F., "A New Broadband Absorption Modulator for Rapid Switching of Microwave Power." Feb. 16, 1961 International Solid-State Circuits Conference. pp. 90-91.

(Continued)

*Primary Examiner*—Jessica Han
(74) *Attorney, Agent, or Firm*—Silicon Edge Law Group LLP; Arthur J. Behiel

(57) ABSTRACT

A high-power modulation system includes drive circuitry that receives input signals from the signal source via a series of transformers. The drive circuitry amplifies the input signals and provides the resulting amplified signals to the high-power switch. The switch includes a series of stacked switching elements, each with a control terminal, first and second current-handling terminals, and feedback path extending between the first current-handling terminal and the control terminal. The feedback paths work in concert to turn the switches on and off together to prevent excessive voltage from developing across one or a subset of the switching elements. The feedback path includes a resistor that dampens the bandwidth of the feedback path to reduce turn-off and turn-on ringing and oscillation. The damping resistor may be coupled in series with a diode that holds charge against the control terminal of the switching element.

10 Claims, 2 Drawing Sheets

OTHER PUBLICATIONS

Strickland, B.E., "A Solid State Modulator Using Energy Recovery to Deliver 20 kVA to an Inductive Load from a 2.5 kJ/s Power Source." CH2839-9/90/0000, 1990 IEEE. pp. 503-506.

Alves, S.T., "An All Solid-State High-Power Modulator for a Ground-Based Radar Transmitter." CH2662-5/88/000030196, 1988 IEEE. pp. 196-201.

Creely, P., "Integrated Thyratron Driver for High-Rep-Rate, High-Power Modulators." CH2662-5/88/0000-0080, 1988 IEEE. pp. 80-83.

Ness, R.M., "0.5 NW 60 KHZ Solid State Power Modulator." CH2662-5/88/0000-0043, 1988 IEEE. pp. 43-47.

Mohan, Ned et al., "Power Electronics: Converters, Applications, and Design." Design of Drive Circuits for BJTS, Chapter 20 BJTS with Drive and Snubber Circuits. Copyright 1989 by John Wiley & Sons, Inc. Title Page, Publication Page, and pp. 508-605.

* cited by examiner

HIGH-VOLTAGE MODULATOR SYSTEM

FIELD OF THE INVENTION

This invention relates to high-power, high-voltage modulators.

BACKGROUND

A broad range of applications require modulators and variable-voltage sources with high peak-power capabilities. Such applications include radar transmitters, X-ray machines, microwave-tube test sets, and semiconductor wafer manufacturing equipment. These machines and equipment employ such high-power amplifiers as cross-field amplifiers, traveling-wave tubes, magnetrons, klystron amplifiers (collectively referred to as "vacuum-electron devices"), and ion implanters. A number of high-voltage modulators are adapted to deliver pulsed power to these types of high-power amplifiers.

Conventional high-voltage modulators can be implemented using vacuum tubes, but the technology increasingly employs solid-state switches, which have higher peak-power capabilities and are more readily available. High-voltage modulators that employ solid-state switches provide excellent high-power, high-speed switching performance. There is always room for improvement, however, as competitive technology markets are ever watchful for cost-competitive systems that offer improved efficiency, reliability, speed performance, or a combination of these. For a detailed discussion of a conventional high-power modulator that employs solid-state switches, see U.S. Pat. No. 6,246,598, which is incorporated herein by reference.

BRIEF DESCRIPTION OF THE DRAWINGS

The subject matter disclosed is illustrated by way of example, and not by way of limitation, in the figures of the accompanying drawings and in which like reference numerals refer to similar elements and in which.

DETAILED DESCRIPTION

Figure 1:
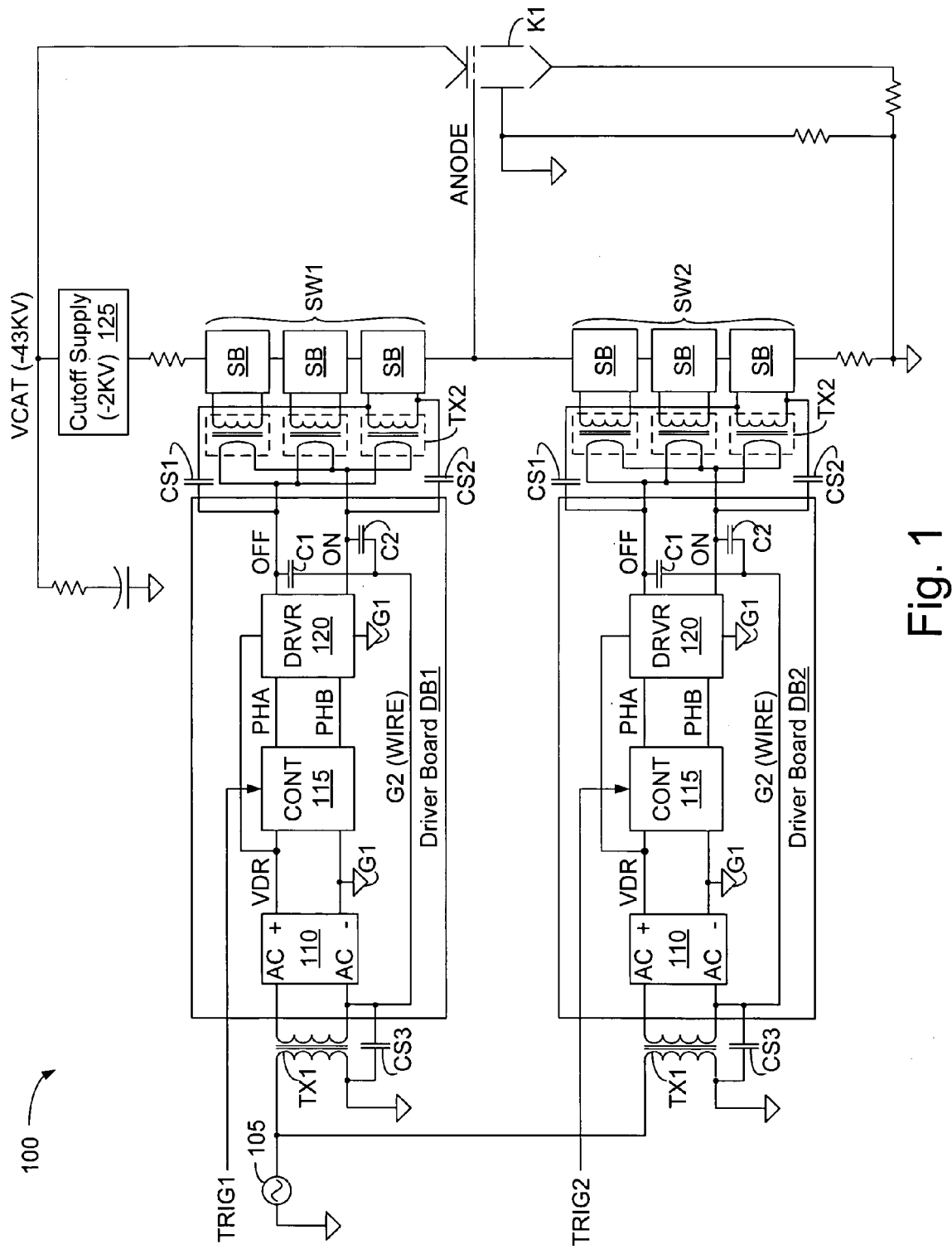
FIG. 1 depicts a high-voltage modulator 100 driving an anode of a klystron K1 in accordance with one embodiment.

FIG. 1 depicts a high-voltage modulator 100 driving an anode of a klystron K1 in accordance with one embodiment. Modulator 100 drives klystron K1 by alternately coupling the klystron anode to a high negative voltage via switch SW1 and a low voltage via switch SW2. Each of switches SW1 and SW2 may include from one to N switch boards SB, coupled in series, with the number depending upon the magnitude of the switched voltage and the voltage rating of the switching elements on boards SB. A pair of driver boards DB1 and DB2 selectively turns switches SW1 and SW2 on and off responsive to optical trigger signals TRIG1 and TRIG2. The driver boards are identical in this embodiment, as are the switches, so the following discussion is limited to driver board DB1 and switch SW1.

Driver board DB1 is powered by an AC source 105 via a first transformer TX1 in this embodiment. The output terminals of transformer TX1 connect to a conventional rectifier 110, the positive and negative output terminals of which supply power to a controller block 115 and a driver 120 as a positive supply voltage VDR on a like-named supply node and zero volts on a ground node G1. Voltage VDR may vary, but is about fifteen volts in one embodiment. As with other designations used herein, VDR refers both to a signal and an associated node: whether a given reference is to a signal or a corresponding node will be clear from the context.

Driver 120 of driver board DB1 provides output pulses to the primary windings of three transformers TX2 via a pair of driver output terminals OFF and ON. The primary windings of transformers TX2 are coupled in parallel so that the secondary windings issue simultaneous on and off pulses in response to pulses on output terminals OFF and ON. The pulses on the secondary windings of transformers TX2 control switch boards SB to open and close switch SW1. In one embodiment, driver 120 issues a one microsecond pulse, from zero volts to VDR, on terminal ON to turn on switch SW1, and issues a subsequent similar pulse on terminal OFF to turn off switch SW1. The time between the pulses on node ON and node OFF determines the on and off times of switch SW1.

In one embodiment, switch SW1 can be turned on for e.g. 100 us by asserting trigger signal TRIG1 for 100 us: controller 115 issues a one-microsecond pulse on node PHB when signal TRIG1 is asserted, and issues a subsequent one-microsecond pulse on node PHA when signal TRIG1 is deasserted. Driver 120 responds to the pulses on nodes PHB and PHA by issuing corresponding pulses on respective driver output nodes ON and OFF to convey current through the primary winding of transformer TX2, and consequently through the secondary windings as well. The current through the secondary windings turns switch SW1 on or off, depending upon the direction of current flow in the secondary windings.

The turns ratio of transformer TX2 can vary, but is 1:1 in this example, with a single primary winding extending through the center of a torrid core. A single primary winding advantageously provides a high degree of voltage isolation between switch SW1 and board DB1. The use of optical triggers and transformer TX1 additionally isolates board DB1.

Figure 2:
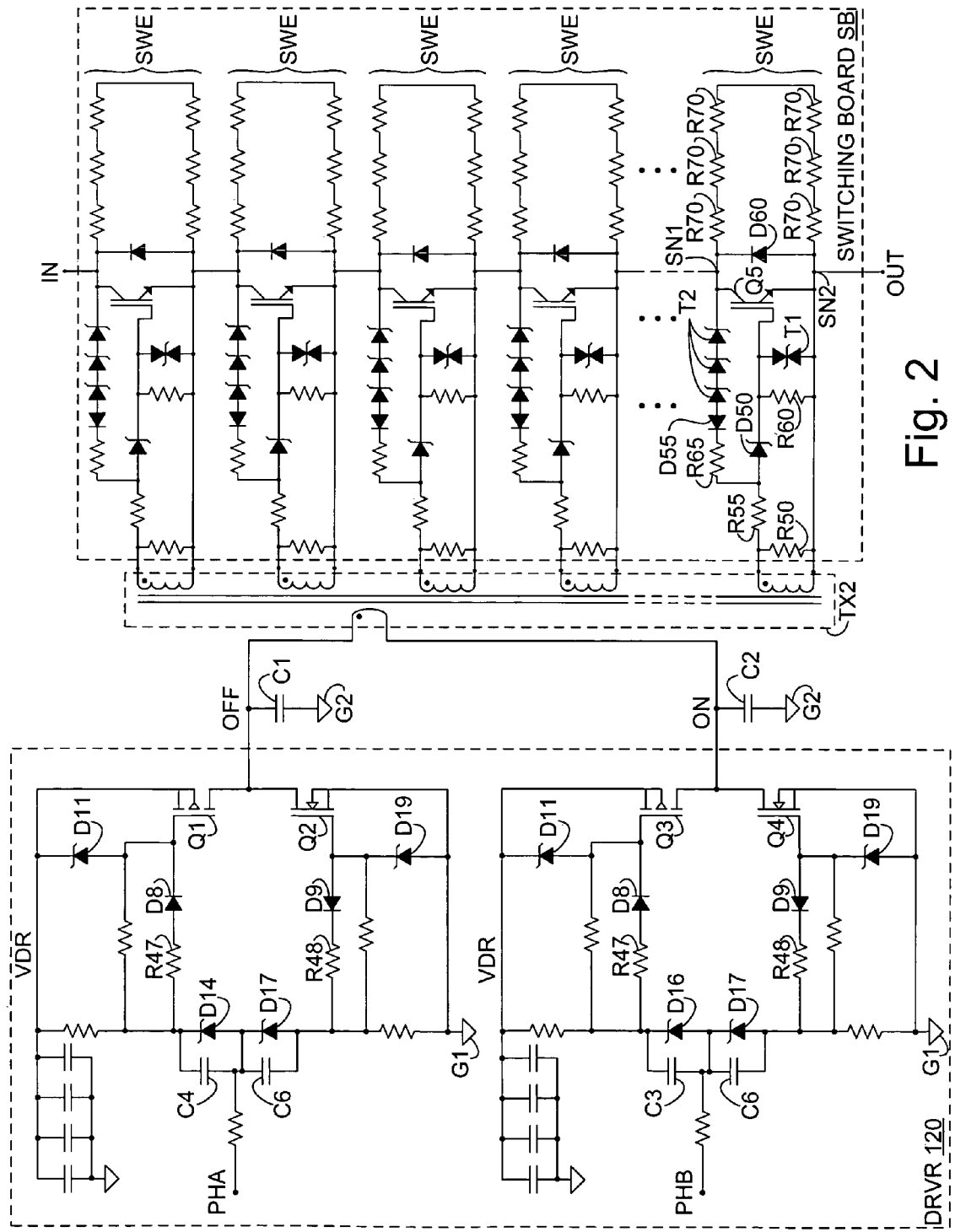
FIG. 2 details embodiments of driver 120 and switch SW2 of FIG. 1. Driver 120 is an "H" bridge with two identical halves driving respective inputs OFF and ON to the primary winding of transformer TX2.

In some embodiments switch SW1 may require one or more refresh pulses to remain on or off for a desired timing interval. In the embodiment of FIG. 2, discussed below, the switch may require refresh-on pulses to remain on for extended periods, but does not require refresh-off pulses. Refresh pulses can be initiated by trigger signals. Alternatively, controller 115 can be configured to refresh periodically to maintain a desired switch state. Other embodiments will differ, as will be readily understood by those of skill in the art.

Modulator 100 may be adapted to switch very high voltages. In one embodiment, klystron K1 employs a cathode voltage VCAT of about −43 KV and a collector voltage of about zero volts. A cutoff supply 125 increases the absolute value of the anode voltage ANODE of klystron K1 to 2 KV above cathode voltage VCAT (to −45 KV) for application by switch SW1. This 2 KV increase ensures klystron K1 turns off and stays off when switch SW1 closes.

Switching high voltages generates high charging currents through stray capacitances CS1 and CS2, which can cause considerable electrical noise to couple to driver board DB1. (Other stray capacitances, such as those associated with the other transformers TX2, are omitted for ease of illustration.) Capacitors C1 and C2 are coupled between respective inputs of transformer TX2 and a second ground G2 to convey this switching noise to the primary winding of transformer TX1 via stray capacitance CS3 through transformer TX1. Ground G2 may be inductively isolated from ground G1 to prevent the noise coupled from switch SW1 via transformer TX2 from interfering with the operation of controller 115 and driver 120. In one embodiment ground G2 is isolated from driver board DB1 by tying the ground side of capacitors C1 and C2 to a ground lug via a low-inductance conductor.

FIG. 2 details driver 120 and one of transformers TX2 switch boards SB, all of FIG. 1, in accordance with one embodiment. In this example, driver 120 is an "H" bridge with two identical halves driving respective inputs OFF and ON to the primary winding of transformer TX2. Switch board SB includes a stack of e.g. twenty series-coupled switching elements SWE, each of which drops about $1/20^{th}$ of the voltage across the one switch board SB. There being three switch boards in the embodiment of FIG. 1, each switching element SWE drops about $1/60^{th}$ of the 45 KV modulated on node ANODE in that embodiment. Each switching element SWE is disposed between and selectively couples first and second high-current source nodes SN1 and SN2, and the depicted series of switching elements work in concert to selectively couple nodes IN and OUT. The configuration of each switching element is identical in this embodiment, so only the lowermost instance of switching element SWE is described in detail. The number of switching elements connected in series may change based upon the magnitude of the switched voltage and the voltage rating of the switching transistors. In one embodiment, the switching elements SWE employ insulated-gate bipolar transistors (IGBTs), but other types of power-switching devices might also be used, as will be readily understood by those of skill in the art.

The following discussion describes how driver 120 responds to a one-microsecond pulse (zero to VDR to zero) on node PHB by issuing a negative-going pulse (VDR to zero to VDR) on terminal ON. The pulse on terminal ON causes current to flow through the primary winding of transformer TX2. The resulting currents through the secondary windings of transformer TX2 turn on all the switching elements SWE in the stack, and consequently turn on switch SW2.

To begin, assume switch SW2 is off (not conducting) and both input signals PHA and PHB are at ground potential. In that case, signals PHA and PHB pull the control terminals of transistors Q1 and Q3 away from VDR, turning transistors Q1 and Q3 on and Q2 and Q4 off. Both input terminals to transformer TX2 are therefore pulled to supply voltage VDR and no current flows through the primary winding. The breakdown voltages of zener diodes D14 and D16 are each 8.2 volts in an embodiment in which VDR is fifteen volts. Capacitors C4 and C3 bypass respective zeners D14 and D16 to reduce the time delay associated with turning on and off transistors Q1 and Q3.

To initiate an on pulse, and thus close switch SW2, signal PHB is pulled to voltage VDR and signal PHA is left at ground potential. Raising PHB turns transistor Q3 off and Q4 on, creating a current path through transistor Q1, the primary winding of transformer TX2, and transistor Q4. To terminate the on pulse, signal PHB is returned to ground, which turns transistor Q3 on and Q4 off, eliminating the current path through the primary winding of transformer TX2.

A zener D17 and a capacitor C6 couple node PHB to the control terminal of transistor Q4 in the same manner diode D16 and capacitor C3 couple node PHB to the control terminal of transistor Q3. Diodes D8 and D9 and resistors R47 and R48 ensure transistors Q3 and Q4 turn off faster than they turn on to prevent transistors Q3 and Q4 from conducting simultaneously during switching. A second pair of diodes D11 and D19 provide source-to-gate over-voltage protection for transistors Q3 and Q4. The H bridge of driver 120 is unusual in that high-side transistors Q1 and Q3 are both biased on while awaiting an input signal on nodes PHA or PHB. The H bridge can therefore generate on pulses by turning on just one transistor. The same is true for off pulses, as noted below. Leaving on just the high-side transistors (or just the low-side transistors) may improve noise immunity by providing low-impedance paths from nodes ON and OFF and supply terminals that evince relatively stable voltages. A more traditional H bridge configuration may be used in other embodiments.

The current pulse from node OFF to node ON causes transformer TX2 to send a current pulse through each secondary winding. With reference to the lowermost winding and the associated switching element SWE, the secondary current develops a positive voltage of e.g. fifteen volts across a resistor R50, the terminals of which are coupled to the input nodes to switch SW2. This voltage is transmitted to the gate of a high-voltage IGBT Q5 via a resistor R55 and a zener diode D50, thereby turning IGBT Q5 on. Diode D50 holds the resulting charge on the gate of IGBT Q5 to keep the IGBT on after the voltage across resistor R50 dissipates. The remaining series-coupled switching elements SWE likewise turn on, effectively closing switch SW2.

The charge collected on the gate of IGBT Q5 bleeds off via a resistor R60 and the leakage through a transient voltage suppressor T1 that provides gate-to-source over-voltage protection for IGBT Q5. Unless this charge is refreshed, switch SW2 will eventually shut off in this embodiment. It may therefore be necessary to refresh the charge periodically if the on-time of switch SW2 is to be relatively long. The IGBTs will typically be turned on and refreshed such that the applied gate voltage maintains them in saturation for as long as switch SW2 is closed.

To initiate an off pulse to open switch SW2, signal PHA to driver 120 is pulled to voltage VDR. Raising PHA turns transistor Q1 off and Q2 on, creating a current path through transistor Q3, the primary winding of transformer TX2, and transistor Q2. Returning signal PHA to ground potential turns transistor Q1 on and Q2 off, eliminating the current path through the primary winding of transformer TX2. The operation of the half of driver 120 disposed between nodes PHA and OFF is identical to the other half in the instant case, like-identified elements being the same or similar, so a detailed discussion is omitted for brevity.

The "off" current from node ON to node OFF causes transformer TX2 to send a current pulse through each secondary winding in the opposite direction of on pulses. With reference to the lowermost switching element SWE, the current through the secondary winding develops a negative voltage of e.g. negative fifteen volts across resistor R50, which charges the gate of IGBT Q5 in the opposite polarity through resistor R55 and zener D50. In an embodiment in which zener D50 drops ten volts, the gate-to-emitter voltages on each IGBT Q5 in the series is about negative five volts. This gate-to-emitter voltage shuts off the transistors, effectively opening switch SW2. The off-pulses on the secondary windings of transformer TX2 should be long enough to complete the transition of the associated transistors Q5 from on to off. Likewise, the on-pulses on the secondary windings of transformer TX2 should be long enough to complete the off-to-on transition.

A feedback path extending between the collector (first current-handling terminal) and gate (control terminal) of IGBT Q5 includes a series of transient voltage suppressors T2, a diode D55, and a damping resistor R65. By elevating the gate voltage on transistor Q5 when the collector voltage exceeds a predetermined level, the feedback path clamps the collector-to-emitter voltage of IGBT Q5 to a level below the manufacturer's absolute maximum voltage rating. By adding or subtracting from the number of transient voltage suppressors T2, the clamping voltage between the collector and emitter of IGBT Q5 can be adjusted to accommodate devices with different collector-to-emitter voltage ratings.

When the voltage between the collector and gate of IGBT Q5 increases above the predetermined level, transient voltage suppressors T2, diode D55, resistor R65, and zener D50 conduct current to the gate of IGBT Q5 to keep the IGBT out of the cutoff mode. Keeping the IGBT out of the cutoff mode lowers the dynamic impedance of the IGBT, and hence the collector-emitter voltage across the IGBT. This action protects the IGBT from over-voltage conditions that might occur due to power-supply transients and when attempting to turn switch SW2 on or off, particularly in the presence of an inductive load. Should transistor Q5 in one switching element turn on more slowly than the others, the resulting voltage developed between the collector and the gate of the slower one of transistors Q5 causes the feedback path to conduct charge to the gate of that transistor, and thus reduces the off-to-on transition time of the transistor. Similarly, should one of the series of transistors Q5 turn off more slowly than the others, the resulting voltage developed between the collector and the gate of the transistor causes the feedback path to conduct charge to its gate to prevent the transistor from turning off too quickly. The feedback paths thus equalize the turn-off times and the turn-on times of switching elements SWE so that no switch or subset of switches suffers a potentially damaging over-voltage condition. This feature advantageously simplifies the task of matching the turn-on and turn-off times of the series devices.

Diode D55 ensures that a majority of the on-current from the secondary winding of transformer TX2 is delivered to the gate/emitter junction of the IGBT, rather than to charge the capacitance associated with the protection path, and additionally prevents current from passing from gate to collector when transistor Q5 is in saturation. Resistor R65 lowers the clamping response of collector-to-gate feedback path to reduce ringing and oscillation. The above-referenced U.S. Pat. No. 6,246,598 (the '598 patent) describes a high-voltage modulator with a feedback scheme similar to that of FIG. 2 of the instant application. The feedback path of the '598 patent is coupled between the collector and gate of the associated transistor without the intervening diode D50, however. Diode D50 isolates the gate of IGBT Q5 from leakage current through the feedback path, and such leakage can interfere with the proper operation of the IGBT. Instead of developing a voltage across resistor R60, leakage current from the feedback path is dissipated through resistors R55 and R50. The feedback path of the '598 patent also lacks resistor R65 and the associated damping effect.

Each IGBT has an associated series of balancing resistors R70 between its emitter and collector. Balancing resistors R70 ensure that each IGBT has about the same collector-to-emitter voltage when switch SW2 is off. In some embodiments, a capacitor can be added in parallel with resistor R70 to further dampen voltage transients, as shown in the '598 patent. A diode D60 connected in parallel with resistors R70 is a fast-recovery voltage device that may be included to prevent transistor Q5 from being reverse biased from emitter to collector. Such reverse conduction might occur, for example, if modulator 100 is used with an inductive load.

In the foregoing description and in the accompanying drawings, specific terminology and drawing symbols are set forth to provide a thorough understanding of the present invention. In some instances, the terminology and symbols may imply specific details that are not required to practice the invention. For example, signals described or depicted as having active-high or active-low logic levels may have opposite logic levels in alternative embodiments. As another example, circuits described or depicted as including IGBTs may alternatively be implemented using any other technology in which a signal-controlled current flow may be achieved.

While the present invention has been described in connection with specific embodiments, variations of these embodiments will be obvious to those of ordinary skill in the art. For example, 1. while the circuitry employed in the feedback path of the above-described switching elements are implemented using discrete components, the switching and feedback circuitry may be integrated in other embodiments; and
2. switching elements and switch boards can be combined in parallel to for increased current-handling.

Moreover, some components are shown directly connected to one another while others are shown connected via intermediate components. In each instance the method of interconnection, or "coupling," establishes some desired electrical communication between two or more circuit nodes, or terminals. Such coupling may often be accomplished using a number of circuit configurations, as will be understood by those of skill in the art. Therefore, the spirit and scope of the appended claims should not be limited to the foregoing description. Only those claims specifically reciting "means for" or "step for" should be construed in the manner required under the sixth paragraph of 35 U.S.C. Section 112.

What is claimed is:

1. A modulator comprising:
   a. a transformer having a primary winding and a secondary winding;
   b. a driver having a driver input node, to receive an input signal, and a driver output node coupled to the primary winding; and
   c. a high-voltage switching element having:
      i. a switch input node coupled to the secondary winding;
      ii. a first high-current source node;
      iii. a second high-current source node;
      iv. a transistor having a control terminal, a first current-handling terminal coupled to the first high-current source node, and a second current-handling terminal coupled to the second high-current source node;
      v. a first diode having a first anode coupled to the switch input node and a first cathode coupled to the control terminal of the transistor; and
      vi. a feedback path extending between the first current-handling terminal and the first anode, the feedback path including at least one second diode having a second anode and a second cathode.

2. The modulator of claim 1, wherein the second cathode of one of the at least one second diodes is coupled to the first current-handling terminal.

3. The modulator of claim 2, wherein the second cathode of another of the at least one second diodes is coupled to the first anode.

4. The modulator of claim 1, further comprising a third diode coupled between the control terminal and the second current-handling terminal.

5. The modulator of claim 1, further comprising at least one additional secondary winding and, for each additional secondary winding, an additional transistor having second and third current-handling terminals coupled in series with the first and second current-handling terminals between the first and second high-current source nodes.

6. The modulator of claim 1, the driver further including a second driver input node and a second driver output node coupled to the primary winding.

7. The modulator of claim 6, the driver further including a first half-bridge coupled between the first driver input node and the first driver output node and a second half-bridge coupled between the second driver input node and the second driver output node.

8. The modulator of claim 7, wherein each of the first and second half-bridges include first and second transistors coupled in series between first and second power-supply terminals.

9. The modulator of claim 1, wherein the primary winding has a single turn.

10. The modulator of claim 1, wherein the feedback path further includes a resistor coupled in series with the second diode.

* * * * *